(12) United States Patent
Mahanta et al.

(10) Patent No.: US 9,795,026 B2
(45) Date of Patent: Oct. 17, 2017

(54) ELECTRONIC PACKAGE THAT INCLUDES FINNED VIAS

(71) Applicant: Intel Corporation, Santa Clara, CA (US)

(72) Inventors: Nayandeep K. Mahanta, Chandler, AZ (US); Joshua D. Heppner, Chandler, AZ (US); Adel A. Elsherbini, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/969,514

(22) Filed: Dec. 15, 2015

(65) Prior Publication Data

US 2017/0171957 A1    Jun. 15, 2017

(51) Int. Cl.
*H05K 1/02* (2006.01)
*H05K 1/18* (2006.01)
*H05K 1/11* (2006.01)

(52) U.S. Cl.
CPC ........... *H05K 1/0206* (2013.01); *H05K 1/115* (2013.01); *H05K 1/18* (2013.01); *H05K 2201/095* (2013.01)

(58) Field of Classification Search
CPC ....... H05K 1/0201; H05K 1/115; H05K 1/116
See application file for complete search history.

(56) References Cited

U.S. PATENT DOCUMENTS

| 7,250,681 | B2 * | 7/2007 | Matsunaga | ....... H01L 21/76801 257/758 |
| 8,908,383 | B1 * | 12/2014 | Railkar | ................ H05K 1/0206 361/704 |
| 2004/0188826 | A1 | 9/2004 | Palanduz et al. | |
| 2006/0109632 | A1 | 5/2006 | Berlin | |
| 2009/0288859 | A1 * | 11/2009 | Ho | ........................ H05K 1/0219 174/252 |
| 2010/0181105 | A1 * | 7/2010 | Hitomi | .................. H01L 21/481 174/266 |
| 2014/0144677 | A1 * | 5/2014 | Wang | .................... H05K 1/0206 174/252 |
| 2014/0318840 | A1 | 10/2014 | Kanda | |
| 2015/0334870 | A1 | 11/2015 | Feng et al. | |
| 2016/0120060 | A1 * | 4/2016 | Kim | ..................... H05K 3/4038 361/720 |
| 2016/0227641 | A1 * | 8/2016 | Ku | ........................ H05K 1/0206 |

OTHER PUBLICATIONS

"International Application Serial No. PCT/US2016/061784, International Search Report mailed Feb. 27, 2017", 3 pgs.
"International Application Serial No. PCT/US2016/061784, Written Opinion mailed Feb. 27, 2017", 9 pgs.

* cited by examiner

*Primary Examiner* — Timothy Thompson
*Assistant Examiner* — Amol Patel
(74) *Attorney, Agent, or Firm* — Schwegman Lundberg & Woessner, P.A.

(57) ABSTRACT

The electronic package includes a substrate that includes a plurality of dielectric layers and conductive routings between the plurality of dielectric layers; wherein the substrate further includes a plurality of thermal finned vias that electrically connect the conductive routings within the substrate to one another; and an electronic component mounted on the substrate, wherein the finned via transfers heat from the electronic component to the substrate and electrically connects the conductive routings within the substrate to the electronic component.

14 Claims, 8 Drawing Sheets

ELECTRONIC PACKAGE THAT INCLUDES FINNED VIAS

BACKGROUND

The performance and reliability of electronic packages is often limited by the presence of local hot-spots within the electronic package. These local hot-spots are usually created by non-uniform power dissipation within the electronic package.

There are commonly circuit elements (e.g., inductors) that cause localized hot-spots within one or more areas of an electronic package. Uniformly dissipating power within electronic packages typically poses a thermal management challenge for electronic package designers.

Conventional electronic packages utilize active and/or passive thermal devices (e.g., heat syncs and heat spreaders respectively). These thermal devices are usually too far removed from the localized hot-spots in the electronic package. In addition, when the thermal devices are too far from the localized hot-spots, the heat dissipating ability of the thermal devices is commonly limited by the (i) performance of thermal interface materials; (ii) limited surface area of the thermal devices; and/or (iii) thermal resistances of different contact portions of various sections of the electronic package.

DESCRIPTION OF EMBODIMENTS

Figure 1:
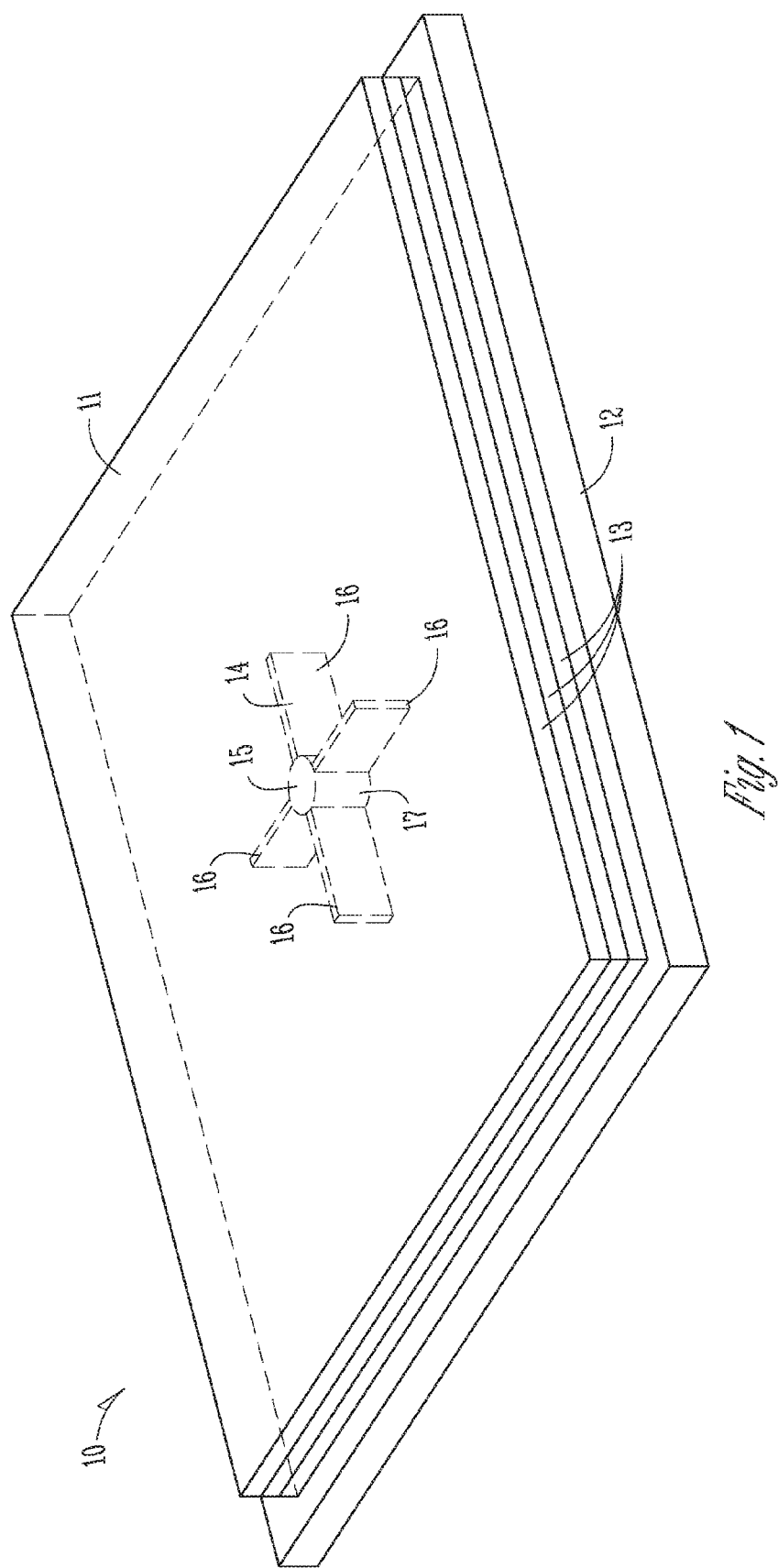
FIG. 1 is a perspective view of an electronic package that includes a thermal tinned via.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the electrical interconnect or electronic package.

The electronic packages described herein may improve the power dissipation within electronic packages. As an example, the electronic package may include thermal tinned vias that are placed at particular locations within the electronic package in order to mitigate the effect of localized hot-spots within the electronic package. The thermal finned vias provide an increased surface area for transferring heat from a localized hot-spot into other portions of the electronic package that surround the thermal finned via.

The thermal finned vias may create localized regions within the electronic package that have higher thermal conductivity. When these thermal finned vias are strategically placed in localized hot-spots within the electronic package, the reliability and performance of the electronic package may be improved.

The electronic packages described herein include substrates that have dielectric layers which have thermal finned vias that may (or may not) provide electrical connection among various circuit elements. In some forms, the thermal finned vias may not be electrically connected to other conductive components in the electronic package such that the finned vias only perform the thermal conduction of heat from one area to another within the electronic package.

The thermal finned vias have a larger surface area as compared to conventional vias such that the thermal finned vias provide improved heat transfer into a via electronic package. The thermal finned vias may increase thermal conductivity in the region within the electronic package that is around the thermal finned vias thereby promoting local heat dissipation. In some forms, the number of fins may be optimized to provide the greatest degree of localized heat spreading by the thermal finned via.

The thermal finned vias may be implemented across multiple dielectric layers of a substrate within an electronic package. When the thermal finned vias are implemented across multiple layers, the thermal finned vias may enhance the heat spreading effect of the thermal finned vias.

In some forms, the thermal finned vias may be utilized within organic substrates. As another example, the thermal finned vias may be utilized in motherboards, through-mold interconnects, and die-to-die interconnects (among other configurations).

FIG. 1 is a perspective view of an electronic package 10. The electronic package 10 includes a substrate 11 and an electronic component 12 mounted to the substrate 11. The substrate 11 includes at least one dielectric layer 13 and conductive routings on both sides of the dielectric layer 13 (and both sides of each dielectric layer 13).

The substrate 11 further includes a thermal finned via 14. The thermal finned via 14 is configured to transfer heat from the electronic component 12 to the substrate 11.

in some forms, the thermal finned via 14 electrically connects the conductive routings within the electronic package 10. It should be noted that the thermal finned via 14 may not electrically connect the conductive routings such that the thermal finned via provides only thermal conduction within the electronic package 10.

The arrangement of the thermal finned via 14 relative to the conductive routings in the electronic package 10 will depend in part on the application where the electronic package 10 is to be used as well as the manufacturing processes that are used to create the electronic package 10 (among other factors).

It should be noted that any type of electronic component 12 that is know now or discovered in the future, may be included in the electronic package 10. As examples, the electronic component 12 may be an active component (e.g., a die) or a passive electronic component (e.g., an inductor).

Figure 2:
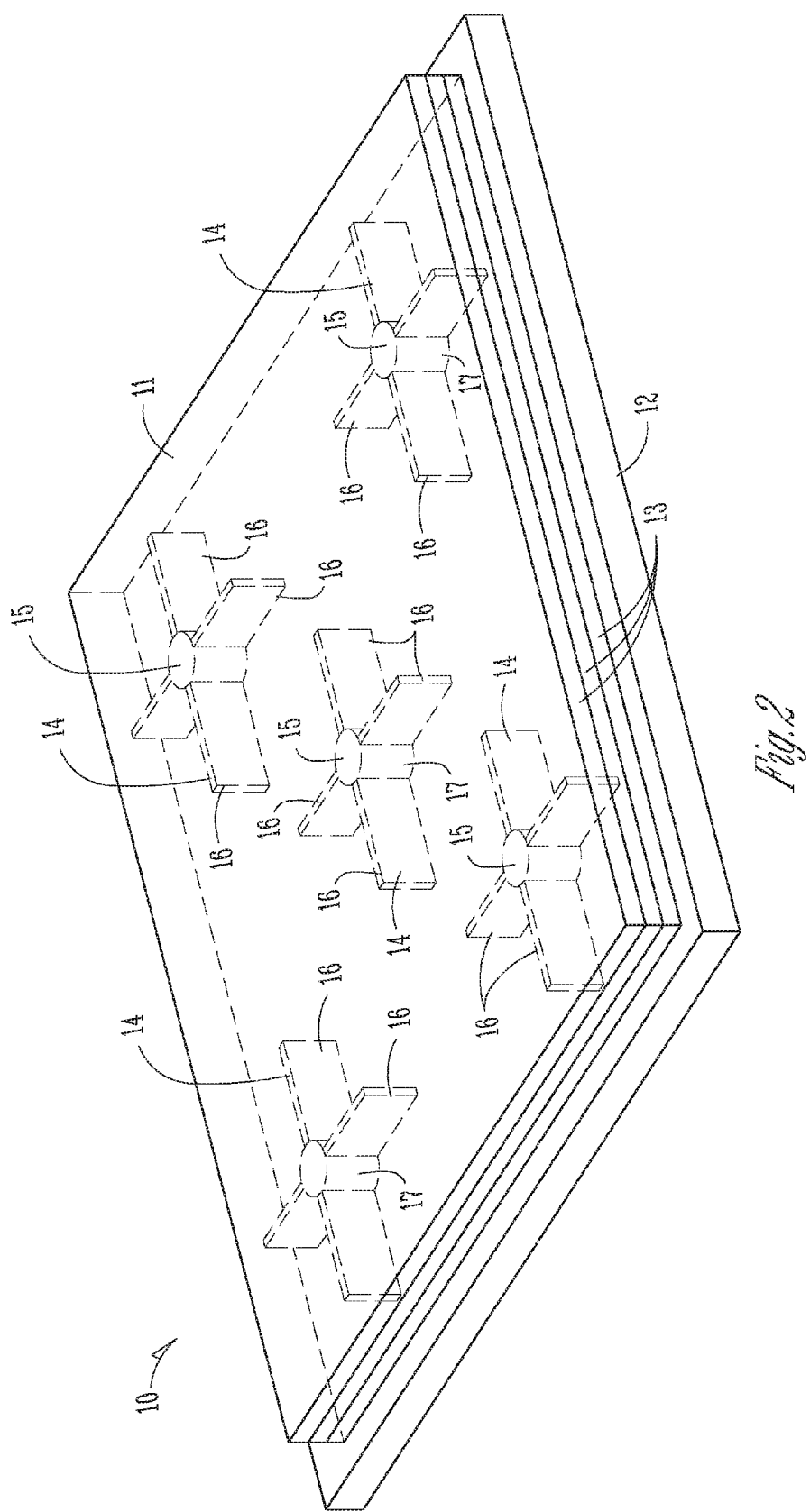
FIG. 2 is a perspective view of an electronic package that includes a plurality of thermal finned vias.

In the electronic packages 10 that are illustrated in FIGS. 1 and 2, the electronic component 12 is shown as being larger than the substrate 11. In other forms, the electronic component 12 may be much smaller (or the same size) as the substrate 11. In addition, more than one electronic component 12 may be mounted to a substrate 11.

In some forms, the electronic component 12 may be attached to the substrate using solder, a conductive epoxy or an anisotropic conductive film (among other materials). In addition, the electronic component 12 may be attached to the substrate 11 using some form of connector (not shown). The manner in which the electronic component 12 is attached to the substrate 11 will depend in part on the manufacturing considerations that are associated with fabricating the electronic package 10 (among other factors).

Referring now also to FIGS. 5-8, the thermal finned via 14 includes a core 15 and a plurality of fins 16 that extend outward from an outer surface 17 of the core 15. In some forms, each of plurality of fins 16 may be linear.

It should be noted that the fins 16 may have other shapes (e.g., curved). It should be noted that one, some or all of the fins 16 may have the same (or different) shapes, type and/or size. In addition, each of the fins 16 may be distributed at equal (or unequal) intervals around the outer surface 17 of the core 15. The size, number and type of fins 16 that are included in the thermal finned via 14 will depend in part on the degree of cooling that is required for the electric component 12 which is cooled by the thermal finned via 14.

In the example illustrated figures, the core 15 has a cylindrical shape. It should be noted that in other forms the core 15 may have a non-cylindrical shape (e.g., a square or a rectangle).

Figure 7:
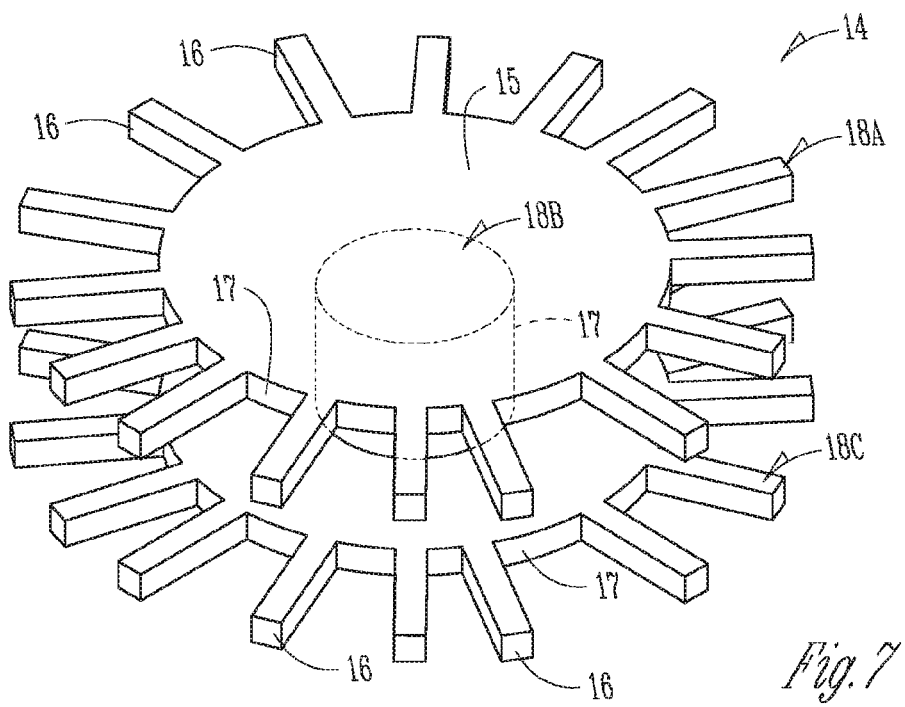
FIG. 7 is a perspective view of another example thermal finned via.
Figure 8:
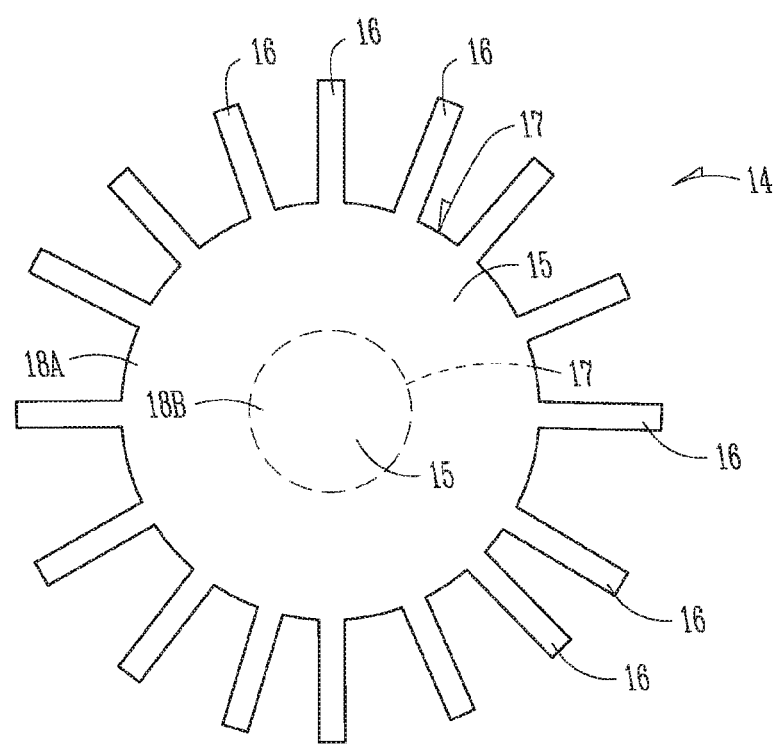
FIG. 8 is a top view of the example thermal finned via shown in FIG. 7.

As shown in FIGS. 7 and 8, the core 15 may include a cylindrical section 18A, 18B, 18C in each dielectric layer. In some forms, at least one of the cylindrical sections 18A, 18B, 18C has a different diameter than the other cylindrical sections 18A, 18B, 18C. The relative sizes of the cylindrical sections 18A, 18B, 18C that form the core 15 will depend in pail on the degree of cooling that is required by the thermal finned via 14 within the electronic package 10 (among other factors).

Figure 4:
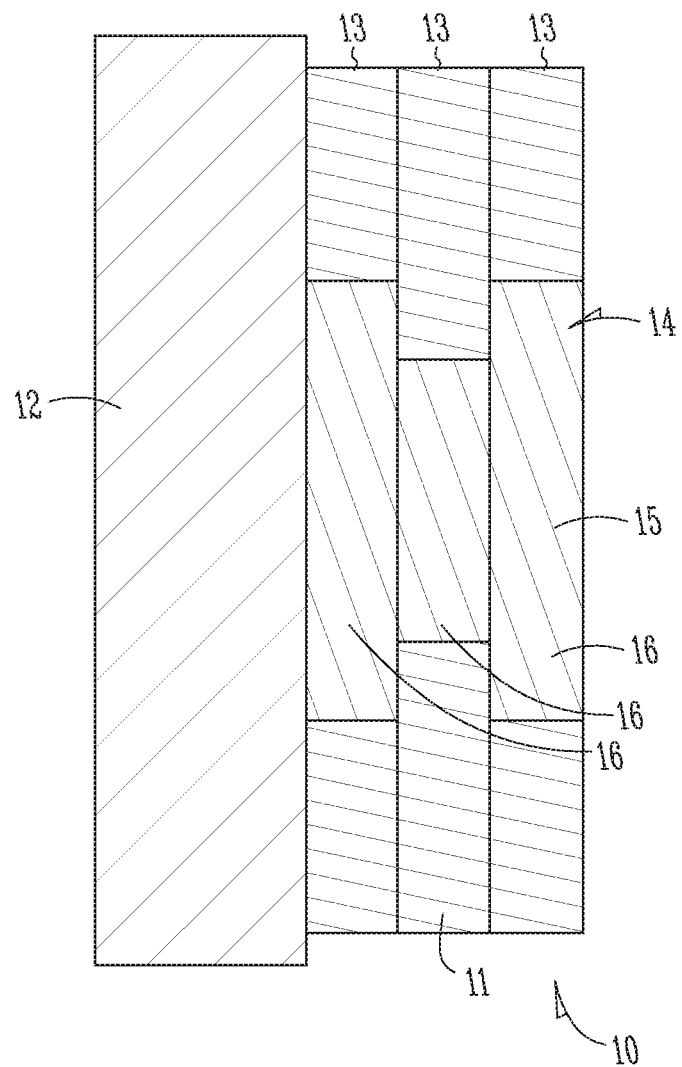
FIG. 4 is a side schematic side view similar to FIG. 3D illustrating an example electronic package that includes a different example thermal finned via.
Figure 5:
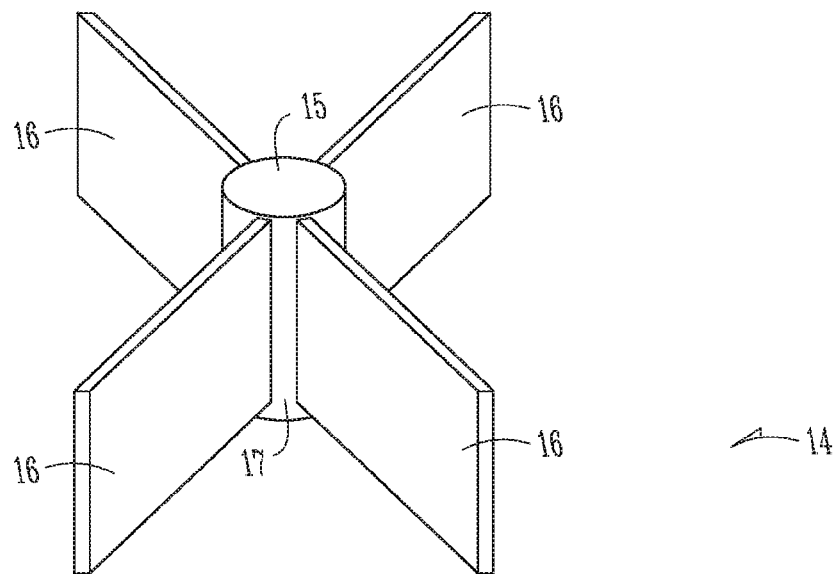
FIG. 5 is a perspective view of an example thermal finned via.
Figure 6:
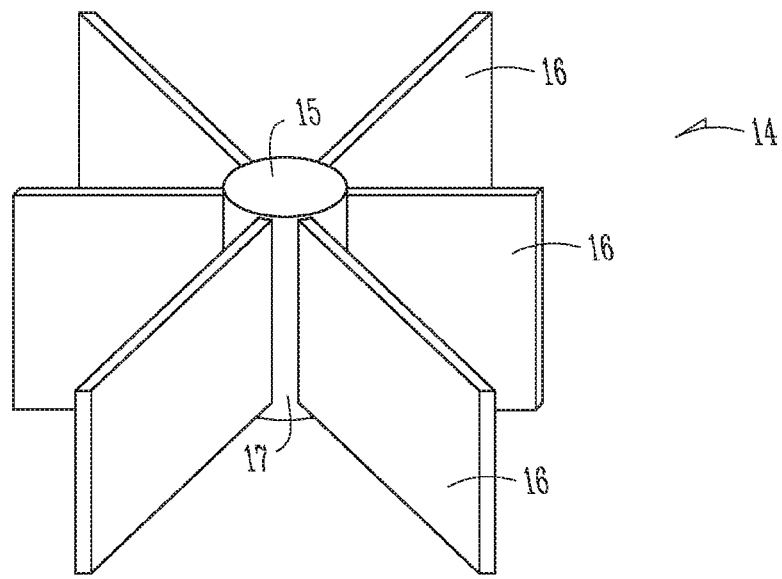
FIG. 6 is a perspective view of another example thermal finned via.

As discussed above, the substrate 11 may be formed of multiple dielectric layers 13. It should be noted that the fins 16 may be in one, some or all of the dielectric layers 13. As shown in FIG. 4, the fins in dielectric layers 18A, 18C are the same while the fin 16 in dielectric layer 18B is different from the fins in dielectric layers 18A, 18C. FIG. 4 shows an example form where the fins 16 are in each of the dielectric layers 13.

In some forms, the thermal fin via 14 has the same shape in each dielectric layer 13 of the substrate 11 where the thermal fin via 14 is located. In other forms, the thermal fin via may have a different shape in some (or all) of the dielectric layers 13 of the substrate 11. The arrangement of the thermal fin via 14 in each dielectric layer 13 of the substrate 11 will depend in part on the degree of cooling that is required of the thermal finned via 14 in the electronic package 10 (among other factors).

It should be noted that the thermal finned via 14 may be a variety of different materials (e.g., copper). In addition, the thermal finned via 14 may be formed of more than one material (e.g., different materials in different dielectric layers).

FIG. 2 is a perspective view of an electronic package 10 that includes a plurality thermal finned vias 14. In some forms, one or more of the thermal finned vias 14 may be located near a portion of electronic component 12 that is configured to generate more heat than other portions of the electronic component 12.

As an example, each of the thermal finned vias 14 may be located near hot spots within the electronic component 12 that are configured to generate more heat than other portions of the electronic component 12. The locations of these hot spots will depend in part on the configuration and operating characteristics of the electronic component 12 (among other factors). Positioning the thermal finned vias 14 near hot spots on the electronic component 12 may improve the performance and reliability of the electronic package 10.

It should be noted be noted the one, some or all of the thermal finned vias 14 may be the same (or different) type of thermal finned via 14 depending on the degree of cooling that is required in the electronic package (among other factors). As an example, one type of thermal finned via 14 may be placed near a hot spot and another type of thermal finned via 14 (or no thermal via at all) may be used at areas that are more distant from the hot spots.

The thermal finned vias 14 that are included in the electronic packages 10 described herein may mitigate hotspots within the electronic packages 10. Mitigating the presence of hot-spots within the electronic packages 10 may improve performance and reliability of the electronic packages 10. In addition, since the electronic packages 10 may provide for more uniform dissipation of heat within the electronic packages 10, more features may be added to the electronic packages 10 without increasing the temperature of the electronic packages 10 during operation of the electronic packages 10.

FIGS. 3A-3D illustrate example techniques for fabricating an electronic package 10 that includes an example thermal finned via 14. FIGS. 3A-3D show a progression of lithography processes that build up the thermal finned via 14 in successive layers 13 of a substrate (3 layers are eventually shown in FIG. 3D). It should be noted that the progression of lithography steps may be repeated until the thermal finned via 14 reaches a desired size and/or configuration.

Figure 3A:
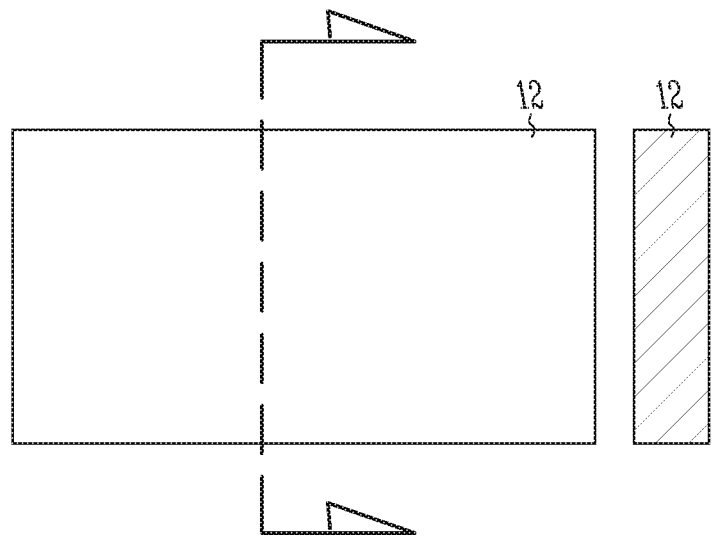
FIGS. 3A-3D illustrate example techniques for making an electronic package that includes an example thermal finned via.
Figure 3B:
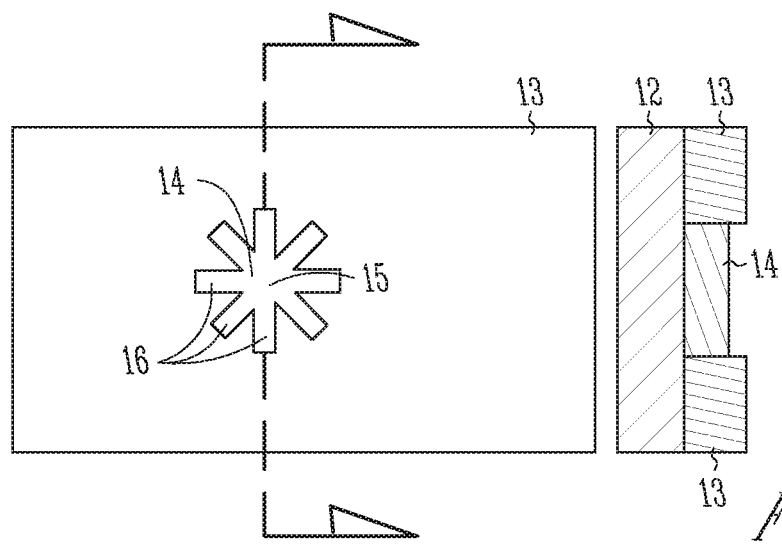
Figure 3C:
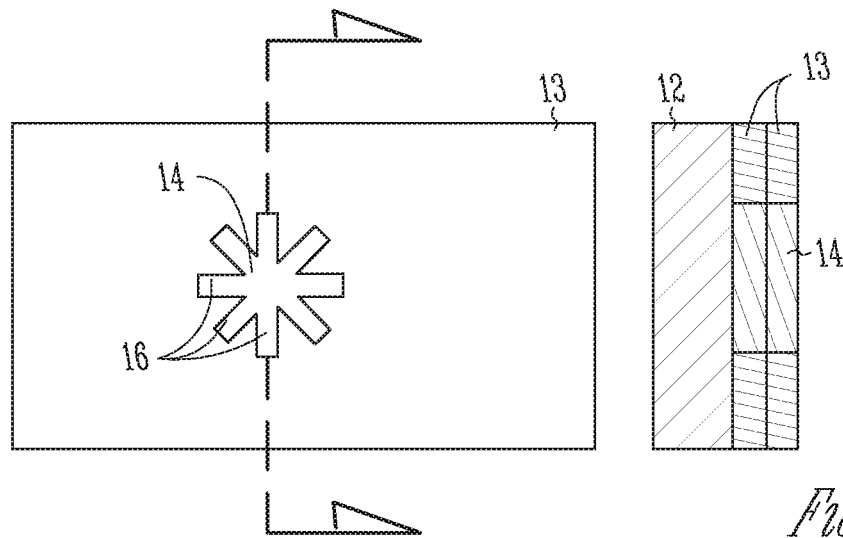
Figure 3D:
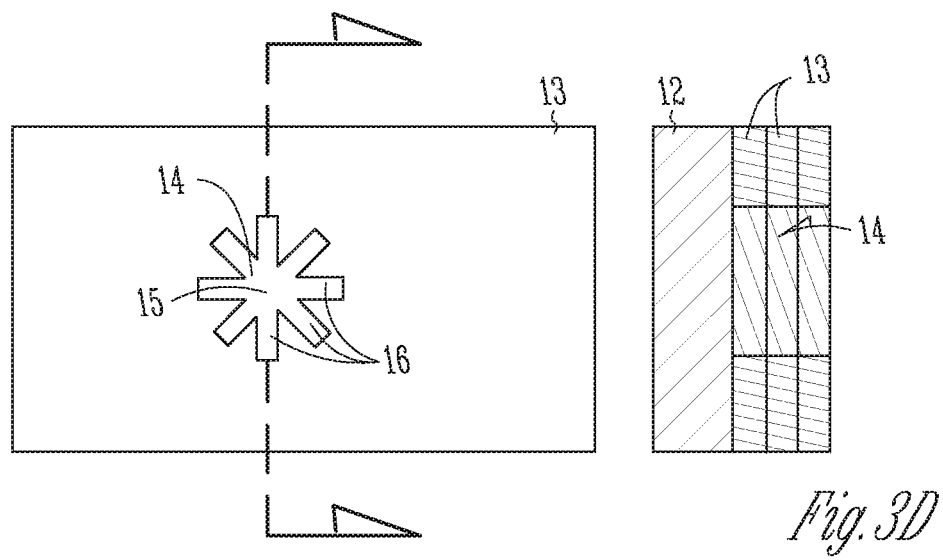

FIG. 4 is a side schematic side view similar to FIG. 3D illustrating an example electronic package 10 that includes a different example thermal finned via 14. A comparison of FIG. 4 with FIG. 3D shows that the thermal finned via 14 has a different configuration in the middle layer (FIG. 4) as opposed to being the same in each layer (FIG. 3D).

Figure 9:
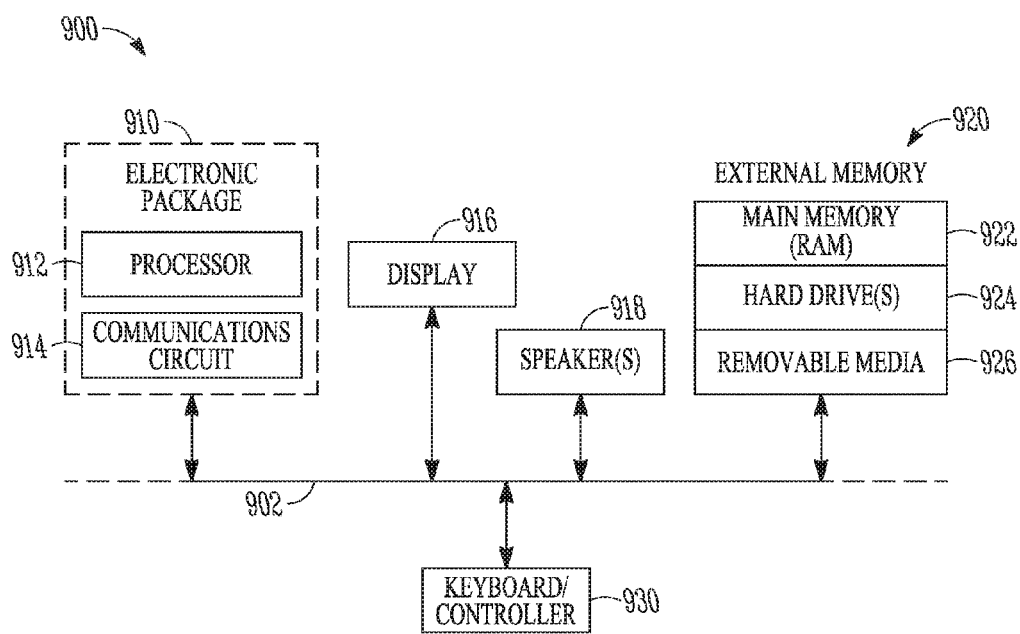
FIG. 9 is block diagram of an electronic apparatus that includes the electrical interconnects and/or electronic packages described herein.

FIG. 9 is a block diagram of an electronic apparatus 900 incorporating at least one electronic package and/or substrate described herein. Electronic apparatus 900 is merely one example of an electronic apparatus in which forms of the electronic packages and/or substrates described herein] may be used.

Examples of an electronic apparatus 900 include, but are not limited to, personal computers, tablet computers, wearables, mobile telephones, game devices, MP3or other digital music players, etc. In this example, electronic apparatus 900 comprises a data processing system that includes a system bus 902 to couple the various components of the electronic apparatus 900. System bus 902 provides communications links among the various components of the electronic apparatus 900 and may be implemented as a single bus, as a combination of busses, or in any other suitable manner.

An electronic assembly 910 that includes any of the electronic packages and/or substrates as described herein may be coupled to system bus 902. The electronic assembly 910 may include any circuit or combination of circuits. In one embodiment, the electronic assembly 910 includes a processor 912 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 910 are a custom circuit, an application-specific integrated circuit (ASIC), or the like, such as, for example, one or more circuits (such as a communications circuit 914) for use in wireless devices like mobile telephones, tablet computers, laptop computers, two-way radios, and similar electronic systems. The IC can perform any other type of function.

The electronic apparatus 900 may also include an external memory 920, which in turn may include one or more memory elements suitable to the particular application, such as a main memory 922 in the form of random access memory (RAM), one or more hard drives 924, and/or one or more drives that handle removable media 926 such as compact disks (CD), flash memory cards, digital video disk (DVD), and the like.

The electronic apparatus 900 may also include a display device 916, one or more speakers 918, and a keyboard and/or controller 930, which can include a mouse, trackball, touch screen, voice-recognition device, or any other device that permits a system user to input information into and receive information from the electronic apparatus 900.

To better illustrate the electronic packages and substrates disclosed herein, a non-limiting list of embodiments is provided herein:

Example 1 includes a substrate. The substrate includes a dielectric layer conductive routings on both sides of the dielectric layer; and a thermal finned via within the dielectric layer.

Example 2 includes the substrate of example 1, wherein the thermal finned via electrically connects the conductive routings.

Example 3 includes the substrate of any one of examples 1-2, and further including additional dielectric layers, wherein the thermal finned via is within more than one dielectric layer.

Example 4 includes the substrate of any one of examples 1-3, wherein the conductive routings are between at least two of the dielectric layers.

Example 5 includes the substrate of any one of examples 1-4, wherein the thermal finned via includes a core and a plurality of fins that extend outwardly from an outer surface of the core.

Example 6 includes the substrate of example 5, wherein each of the plurality of fins is linear.

Example 7 includes the substrate of example 5, wherein each of the fins is distributed at equal intervals around the outer surface of the core.

Example 8 includes the substrate of example 5, wherein the core has a cylindrical shape.

Example 9 includes the substrate of example 5, wherein the core includes a cylindrical section in each dielectric layer, wherein at least one of the cylindrical sections has a different diameter than the other cylindrical sections.

Example 10 includes the substrate of example 5, wherein the fins are in some of the dielectric layers.

Example 11 includes the substrate of any one of examples 1-10, wherein the thermal finned via has the same shape in each dielectric layer of the substrate where the thermal finned via is located.

Example 12 includes an electronic package. The electronic package includes a substrate that includes a plurality of dielectric layers and conductive routings between the plurality of dielectric layers; wherein the substrate further includes a thermal finned via; and an electronic component mounted to the substrate, wherein the thermal finned via is configured to transfer heat from the electronic component to the substrate.

Example 13 includes the electronic package of example 12, wherein the thermal finned via is electrically connected to the electronic component.

Example 14 includes the electronic package of any one of examples 12-13, wherein the thermal finned via electrically connects the conductive routings in different dielectric layers.

Example 15 includes the electronic package of any one of examples 12-14, wherein the thermal finned via is located near a portion of the electronic component that is configured to generate more heat than other portions of the electronic component.

Example 16 includes the electronic package of any one of examples 12-15, wherein the substrate further includes at least one additional thermal finned via within the substrate.

Example 17 includes the electronic package of example 16, wherein each of the thermal finned vias is located near a separate portion of the electronic component that is configured to generate more heat than other portions of the electronic component.

Example 18 includes an electronic package. The electronic package includes a substrate that includes a plurality of dielectric layers and conductive routings between the plurality of dielectric layers; wherein the substrate further includes a plurality of thermal finned vias that electrically connect the conductive routings within the substrate to one another; and an electronic component mounted on the substrate, wherein the thermal finned via is configured to transfer heat from the electronic component to the substrate and electrically connects the conductive routings within the substrate to the electronic component.

Example 19 includes the electronic package of example 18, wherein each of the thermal finned vias is located near a separate portion of the electronic component that is configured to generate more heat than other portions of the electronic component.

Example 20 includes the electronic package of any one of examples 18-19, wherein each of the thermal finned vias includes a core and a plurality of fins that extend outwardly from an outer surface of the core, wherein each of the cores has a cylindrical shape.

This overview is intended to provide non-limiting examples of the present subject matter. It is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "of" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. In addition, the order of the methods described herein may be in any order that permits fabrication of an electrical interconnect and/or package that includes an electrical interconnect. Other embodiments can be used, such as by one of ordinary skill in the art upon reviewing the above description.

The Abstract is provided to comply with 37 C.F.R. §1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A substrate comprising:
   a plurality of dielectric layers, each of the dielectric layers extending in parallel planes;
   conductive routings on both sides of each dielectric layer; and
   a thermal via extending through the dielectric layers, wherein the thermal via includes a core that has an upper surface, a lower surface, a side surface and a plurality of fins that extends from the side surface of the core into the plurality of dielectric layers, wherein each of the fins in the plurality of fins is in a plane that is transverse to the parallel planes of the dielectric layers.

2. The substrate of claim 1, wherein the thermal via electrically connects the conductive routings.

3. The substrate of claim 1, wherein each of the fins in the plurality of fins extends straight out from a longitudinal axis of the core.

4. The substrate of claim 3, wherein each of the fins in the plurality of fins extends straight out from a longitudinal axis of the core at equal intervals around the side surface of the core.

5. The substrate of claim 1, wherein the core has a cylindrical shape.

6. The substrate of claim 1, wherein the thermal via has the same shape in each dielectric layer of the substrate where the thermal via is located.

7. An electronic package comprising:
   a substrate that includes a plurality of dielectric layers and conductive routings between the plurality of dielectric layers;
   wherein the substrate further includes a thermal via, wherein the thermal via includes a core that extends through the plurality of dielectric layers and has an upper surface, a lower surface and side surface and a plurality of fins that extend from the side surface of the core, wherein each of the fins in the plurality of fins includes an upper surface that coplanar with the upper surface of the core and a lower surface that is coplanar with the lower surface of the core; and
   an electronic component mounted to the substrate, wherein the thermal via is configured to transfer heat from the electronic component to the substrate.

8. The electronic package of claim 7, wherein the substrate further includes at least one additional thermal via within the substrate.

9. The electronic package of claim 8, wherein each of the thermal vias in the plurality of thermal vias is located near a separate portion of the electronic component that is configured to generate more heat than other portions of the electronic component.

10. The electronic package of claim 7, wherein the substrate extends in a first plane and each of the fins in the plurality of fins extends from a side surface of the core in a second plane that is transverse to the first plane of the substrate.

11. The electronic package of claim 7, wherein the core has a cylindrical shape.

12. An electronic package comprising:
   a substrate that includes a plurality of dielectric layers and conductive routings between the plurality of dielectric layers;
   wherein the substrate further includes a plurality of thermal vias that electrically connect the conductive routings within the substrate to one another, wherein each of the vias in the plurality of thermal vias includes a core that has a cylindrical section in each dielectric layer, wherein each cylindrical section of the core has a uniform diameter within a respective one of the dielectric layers, wherein at least one of the cylindrical sections in each thermal via has a different diameter than the other cylindrical sections, wherein each core in each thermal. via includes a plurality of fins that extend outwardly from a side surface of the core; and
   an electronic component mounted on the substrate, wherein each of the thermal vias in the plurality of thermal vias is configured to transfer heat from the electronic component to the substrate and electrically connect the conductive routings within the substrate to the electronic component.

13. The electronic package of claim 12, wherein each of the thermal vias in the plurality of thermal vias is located near a separate portion of the electronic component that is configured to generate more heat than other portions of the electronic component.

14. The electronic package of claim 12, wherein the substrate extends in a first plane and each of the fins in each of the plurality of fins extends from a side surface of the core in a second plane that is transverse to the first plane of the substrate.

\* \* \* \* \*